(12) United States Patent
Bomhoff et al.

(10) Patent No.: US 6,809,675 B1
(45) Date of Patent: Oct. 26, 2004

(54) REDUNDANT ANALOG TO DIGITAL STATE MACHINE EMPLOYED TO MULTIPLE STATES ON A SINGLE LINE

(75) Inventors: Matthew D. Bomhoff, Tucson, AZ (US); Brian J. Cagno, Tucson, AZ (US); Gregg S. Lucas, Tucson, AZ (US); Andrew E. Seidel, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/795,169

(22) Filed: Mar. 5, 2004

(51) Int. Cl.$^7$ ............................................... H03M 1/12
(52) U.S. Cl. ...................................... 341/155; 341/165
(58) Field of Search ............................. 341/118, 120, 341/122, 155, 157, 158, 159, 169, 170; 365/185.03, 185.2, 185.21; 327/165, 306

(56) References Cited

U.S. PATENT DOCUMENTS

| | | | |
|---|---|---|---|
| 4,353,059 A | | 10/1982 | Vaitkus |
| 4,939,518 A | | 7/1990 | Hotta et al. |
| 4,992,956 A | * | 2/1991 | Kaku et al. ................. 358/1.15 |
| 5,148,449 A | | 9/1992 | Cannalte et al. |
| 5,184,128 A | * | 2/1993 | Snow .......................... 341/128 |
| 5,274,778 A | * | 12/1993 | Hall ........................ 365/185.21 |
| 5,321,403 A | * | 6/1994 | Eng et al. ..................... 341/168 |
| 5,565,869 A | * | 10/1996 | Brodie et al. ................ 341/168 |
| 5,751,234 A | * | 5/1998 | Schlotterer et al. ......... 341/139 |
| 5,751,632 A | | 5/1998 | Choi et al. |
| 6,072,417 A | * | 6/2000 | Staton ......................... 341/165 |
| 6,144,330 A | * | 11/2000 | Hoffman et al. ............ 341/166 |
| 6,259,084 B1 | * | 7/2001 | Kochis et al. ............ 250/208.1 |
| 6,480,134 B1 | | 11/2002 | Sasaki |
| 6,687,493 B1 | * | 2/2004 | Sorrells et al. ............. 455/323 |
| 6,697,350 B2 | * | 2/2004 | Lomp ......................... 370/342 |
| 6,721,301 B2 | * | 4/2004 | Ozluturk et al. ............ 370/342 |

\* cited by examiner

*Primary Examiner*—Michael Tokar
*Assistant Examiner*—Linh V Nguyen
(74) *Attorney, Agent, or Firm*—Quarles & Brady Streich Lang LLP

(57) ABSTRACT

A state machine is used to remove residual electric charge from a sense line and to sample the voltage of the sense line at multiple pre-determined times to determine the presence of a terminating capacitor and its value. Various values of capacitors identify discrete conditions. These discrete conditions may identify different types of plug-in cards or models of plug-in cards within a group type.

18 Claims, 8 Drawing Sheets

REDUNDANT ANALOG TO DIGITAL STATE MACHINE EMPLOYED TO MULTIPLE STATES ON A SINGLE LINE

BACKGROUND OF THE INVENTION

1. Field of the Invention

This invention is related in general to the field of computer systems. In particular, the invention consists of a programmable logic device that implements a state machine to perform analog-to-digital conversion of a capacitively terminated signal.

2. Description of the Prior Art

Using traditional digital logic standards such as transistor-transistor-logic ("TTL"), it is only possible to detect two conditions, i.e., a logic-high or a logic-low state. While modern digital devices have the ability to detect a third state, i.e., a high-impedance state, digital detection-devices typically utilize each detection line ("sense line") to indicate only the traditional logic-high and logic-low states. This poses severe limitations when it is desired to detect three or more conditions. For example, a typical system that includes a connector designed to accept plug-in cards can only identify two different types of cards utilizing a single sense line. Additional types of cards can only be differentiated by utilizing more than one sense line. Using a binary detection system, the number of conditions that can be detected Nd is equal to the number two raised to a power that is equivalent to the number of sense lines Ns:

$$Nd=2^{Ns}.$$

In this manner, one sense line can detect two conditions, two sense lines can detect four conditions, and three sense lines can detect up to eight conditions. Returning to the example of a system with a connector for accepting plug-in cards, the ability to detect twenty different types of cards would require the use of at least five sense lines (four sense lines is insufficient as two raised to the power of four can only identify sixteen disparate conditions). Using multiple sense lines is problematic as it increases the number of signal traces on a system's circuit board and the number of connector pins dedicated to plug-in card identification. This requires a larger circuit board and connector or a reduction in the available resources for other signals. Additionally, plug-in cards accomodating multiple sense lines also require an increased number of electrical traces and connector pins.

In U.S. Pat. No. 4,939,518, Massao Hotta et. al. disclose utilizing an analog to digital converter ("A/D converter") to sample an analog voltage signal at N different voltage levels. Using a cyclic averaging A/D converter, the analog voltage signal is sampled and input into numerous comparators. If applied to the connector/plug-in card example, the Hotta device would require only a single detection line and associated connector pin.

An important aspect of Hotta's invention is a cyclic averaging A/D converter that can be readily implemented with integrated circuits ("ICs"). A voltage-dividing circuit generates reference voltages at N levels. The generated reference voltages are divided into groups of M elements and N+N/M switches are used to input the reference voltages into N/M comparators.

This approach requires an excessively large number of switches and comparators. Additionally, each reference voltage level is associated with a resistor in the voltage-divider circuit. While the switches and comparators may be implemented with either analog or digital devices, resistors are extremely problematic to implement in the digital domain. Accordingly, the Hotta A/D converter requires the use of a relatively large amount of circuit-board space for the implementation of switches, comparators, and the voltage-dividing circuit. Accordingly, it would be advantageous to utilize an A/D converter to detect numerous conditions on a single detection line without the need for a disproportionately large number of comparators, switches, and resistors.

SUMMARY OF THE INVENTION

The invention disclosed herein is a system implementing a state machine to detect a large number of disparate conditions on a single sense line. The state machine is an implementation of an A/D converter that measures the time that is required for the sense line to go from a ground/logic-low state to a threshold voltage/logic-high state. The state machine and associated sense line may be utilized to identify one of numerous disparate plug-in cards inserted into a connector. Each plug-in card includes a termination circuit that includes either a grounding device or a terminating capacitor. Multiple sense lines may be utilized to simultaneously identify multiple plug-in cards inserted into a multitude of connectors.

One aspect of this invention is that each type of plug-in card may include a terminating capacitor of a unique value. A connector may be designed to accept multiple different types of plug-in cards such as modems, network interface cards, video graphic adapters, and audio input/output cards. Each type of card may utilize a terminating capacitor of a certain value or within a specified range of values. For example, modems may be associated with a capacitor value of approximately ten micro-farads while video graphic adapters may correspond to a capacitive value of about twenty micro-farads. Additionally, models of plug-in cards may be identified within type groups. Modem plug-in cards may be assigned a range of values, say five to fifteen micro-farads. A particular model of modem may be identified by using an assigned capacitive value within that range.

An advantage of this invention is that it can be implemented using programmable logic devices such as field-programmable gate arrays ("FPGAs") or complex programmable logic devices ("CPLDs"). This locates the A/D conversion process within a digital IC, eliminating the need for a large number of switches, comparators, and resistors.

Another aspect of this invention is the ability to utilize additional state machines to implement a fully redundant detection system. While a single state-machine may be connected to numerous sense lines, only one A/D conversion may take place within that state machine at any given time. If multiple plug-in cards are inserted at approximately the same time, only the first plug-in card may be initially identified by a single state-machine. Identification of subsequent plug-in cards must wait until the state machine becomes available. However, additional state machines may be used to simultaneously identify other plug-in cards. Because multiple A/D conversions should not occur on the same capacitor, a redundant A/D conversion begins with the state machine checking a handshake signal to determine if another state machine is performing a conversion on the same sense line.

Various other purposes and advantages of the invention will become clear from its description in the specification that follows and from the novel features particularly pointed out in the appended claims. Therefore, to the accomplishment of the objectives described above, this invention comprises the features hereinafter illustrated in the drawings, fully described in the detailed description of the preferred embodiments and particularly pointed out in the claims. However, such drawings and description disclose just a few of the various ways in which the invention may be practiced.

DESCRIPTION OF THE PREFERRED EMBODIMENTS

This invention is based on the idea of using a state machine, a discharge circuit, and a charging circuit to: (1) remove residual electrical charge from a terminating capacitor, (2) place electric charge on the terminating capacitor in a controlled manner, and (3) monitor the time necessary for the capacitor to reach a threshold voltage. By evaluating the recharge time, the value of the terminating capacitor may be determined. This capacitor value may then be used to identify a discrete condition. In this manner, a single electrical signal may be utilized to identify one of a multiple of discrete conditions corresponding to a multitude of capacitive values.

Figure 1:
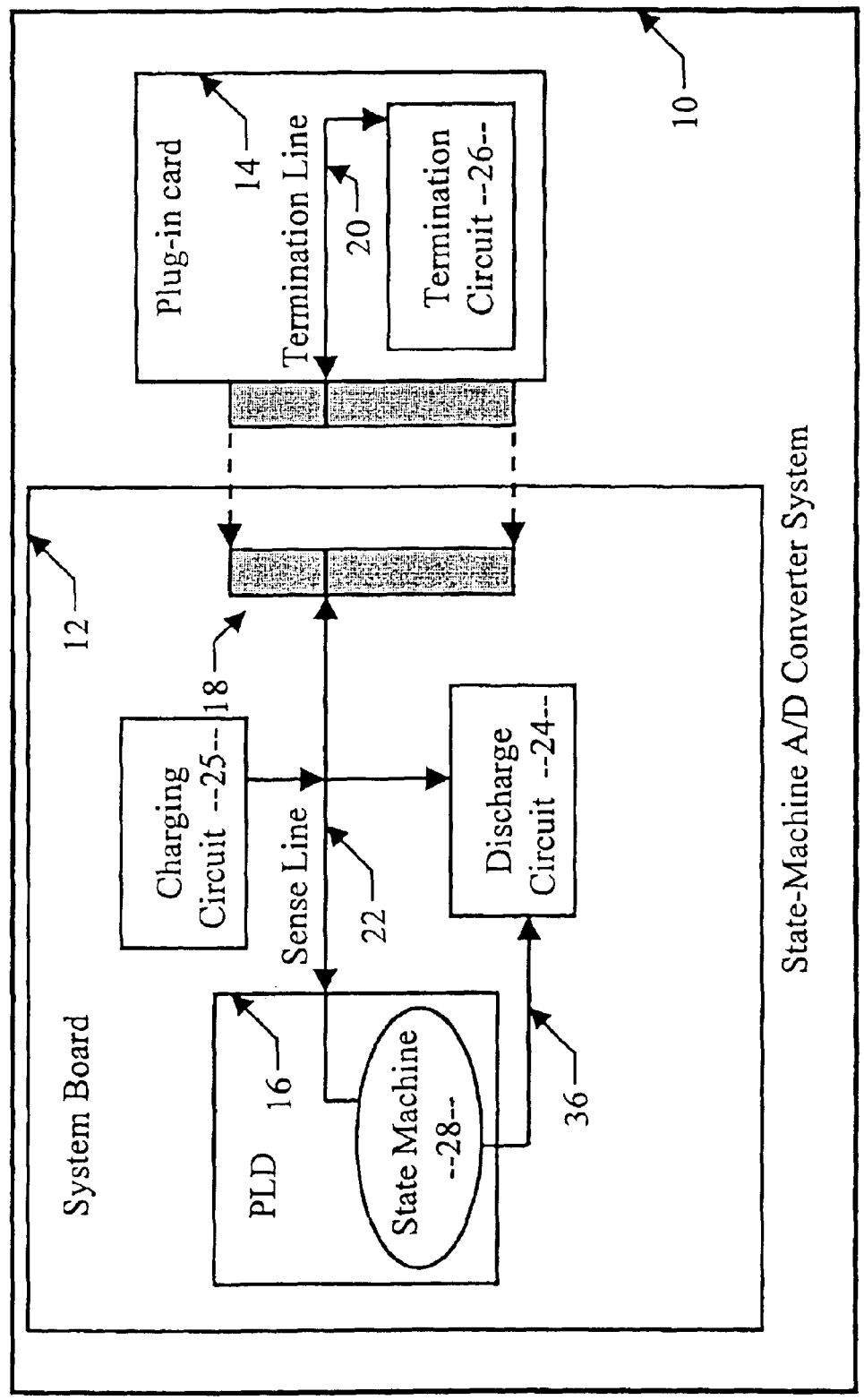
FIG. 1 is a schematic diagram of a state-machine analog-to-digital converter system in accordance with the invention, wherein a single sense line may be utilized to detect a large number of discrete conditions.

Referring to the figures, wherein like parts are designated with the same reference numerals and symbols, FIG. 1 is a schematic illustration of a state-machine analog-to-digital converter system 10 that includes a system board 12 and a plug-in card 14. The system board 12 includes a programmable logic device 16, such as an field-programmable gate array ("FPGA") or a complex programmable logic device ("CPLD"). The plug-in card 14 is inserted into a connector 18 allowing a termination line 20 to electrically connect with a sense line 22. A discharge circuit 24 is used to remove residual electric charge from the termination circuit 26. A charging circuit 25 places electric charge on the sense line 22 in a controlled manner. The state machine 28 monitors the sense line 22 and controls the discharge circuit 24.

The state machine 28 is an algorithmic construct residing in the programmable logic device 16. Utilizing an FPGA or CPLD allows the state machine 28 to be implemented as a hardware construct. Other types of programmable logic devices may be utilized to implement the state machine as either a hardware or software construct. One example is a micro-processor running a software algorithm that emulates the state machine 28.

Figure 2A:
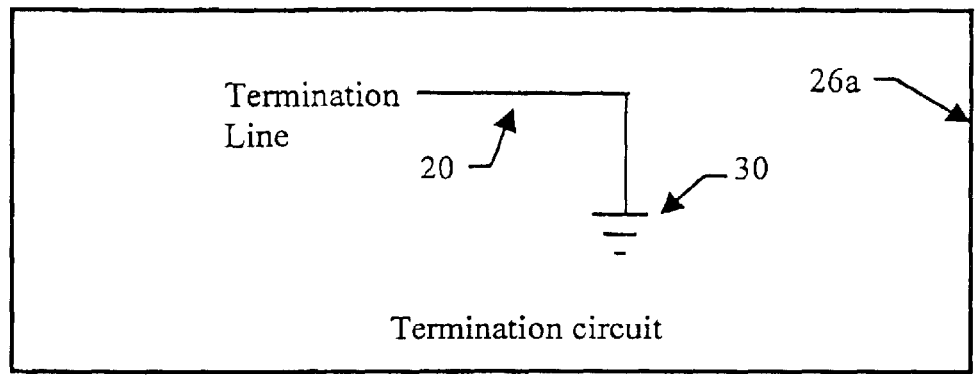
FIG. 2a is a schematic diagram of a termination circuit comprising a grounding device, in accordance with the system illustrated in FIG. 1.
Figure 2B:
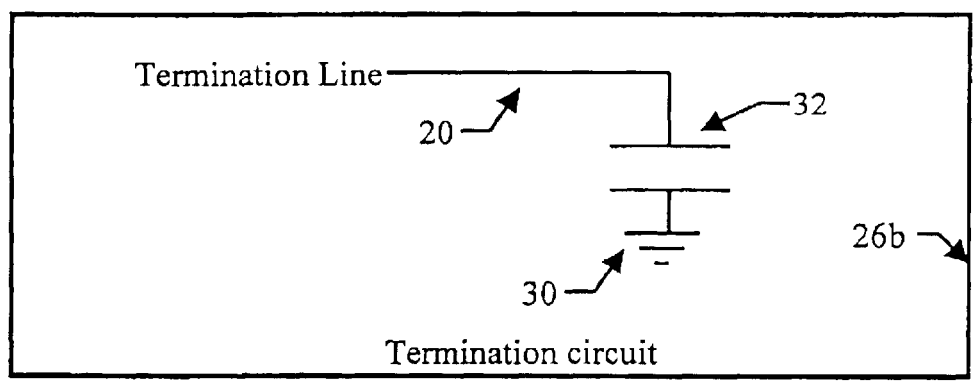
FIG. 2b is a schematic diagram of a termination circuit comprising a grounded capacitor, in accordance with the system illustrated in FIG. 1.

FIG. 2a is a schematic diagram illustrating one example of the termination circuit 26. The termination line 20 is simply connected to a grounding device 30. In FIG. 2b, a terminating capacitor 32 has been inserted between the termination line 20 and the grounding device 30. By using capacitors of various values, electrical properties of the the terminating circuit 26 are changed. Specifically, capacitors with a higher capacity rating require a larger amount of electric charge to develop a particular electric potential (voltage) than do capacitors with smaller capacity ratings. Capacitors having practically any value may be utilized in the termination circuit 26, without limitation to the scope of the invention.

Figure 3A:
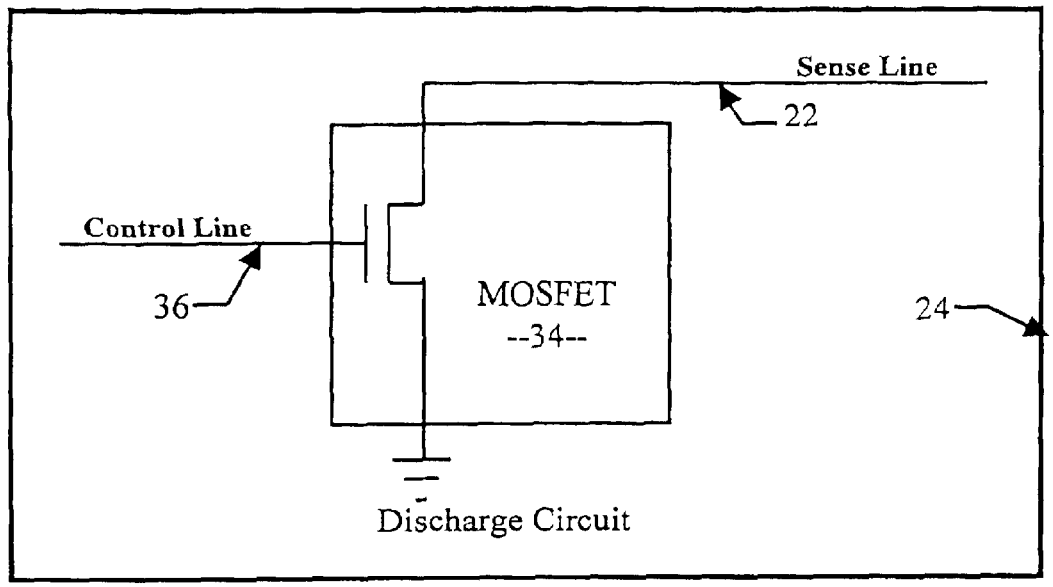
FIG. 3 is a schematic diagram of a discharge circuit used to remove residual electric charge from a sense line, in accordance with the system illustrated in FIG. 1.

The discharge circuit 24 is illustrated by the schematic diagram in FIG. 3a. A transistor 34 is controlled by the control line 36 which is, in turn, driven by the state machine 28. The transistor 34 removes residual electric charge from the sense line 22 which is electrically connected to the termination line 20 through the connector 18. If the termination device 26 includes a terminating capacitor 32, any electrical charge residing on the terminating capacitor 32 will be drained to ground.

Figure 3B:
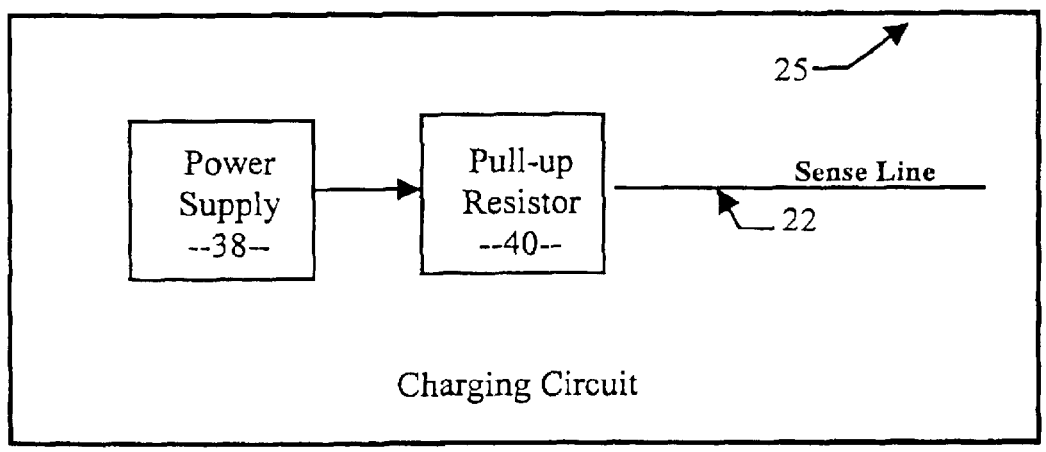

The charging circuit 25 is illustrated by the schematic diagram in FIG. 3b. A power supply 38 is connected to the sense line 22 through a pull-up resistor 40. When the transistor 34 (FIG. 3a) is turned off, electric current flows from the power source 38 through the pull-up resistor 40, sense line 22, connector 18, and termination line 20 to the termination circuit 26. If the termination circuit includes only the grounding device 30 as illustrated in FIG. 2a, the electric current flows to ground and no voltage develops on the sense line. However, if the terminating capacitor 32 of FIG. 2b is present, electric charge accumulates on the terminating capacitor 32 and creates an electric field. This results in a voltage being developed on the termination line 20 and associated sense line 22.

The voltage developed on the sense line is a time variant signal Vs(t) that is a function of the power source voltage Vdd, the value of the pull-up resistor R, and the value of the terminating capacitor C, as expressed by the following equation:

$$V_S(t) = Vdd - Vdd * e^{(-t/R*C)}.$$

The sense line 22 is monitored by the state machine 28 to determine when the voltage signal exceeds a minimum threshold voltage ("Vth"). Using TTL logic, a logic-high state occurs at a minimum threshold of approximately 2.4 volts.

Figure 4:
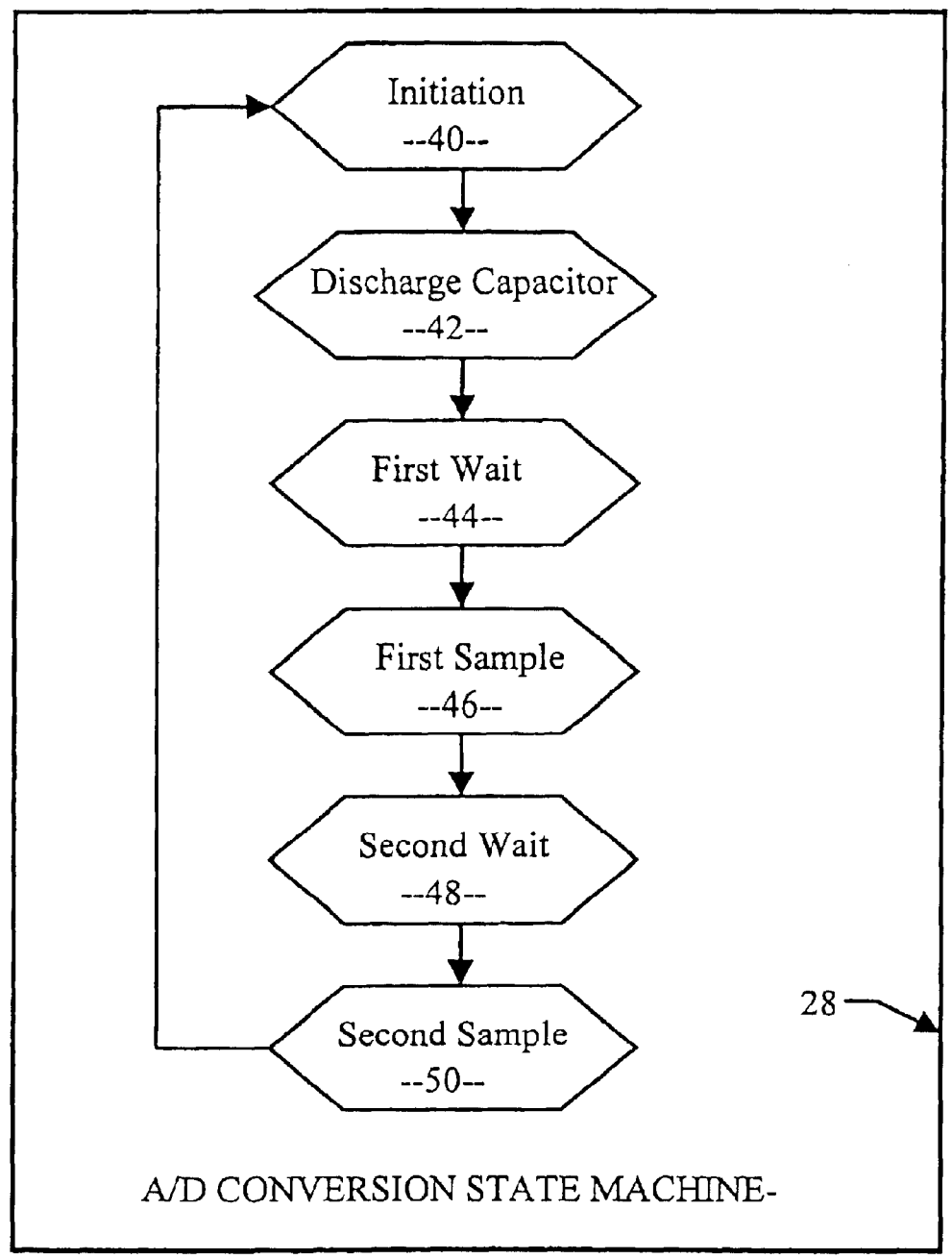
FIG. 4 is a flowchart illustrating an A/D conversion state-machine being utilized to perform analog-to-digital conversion, in accordance with the system illustrated in FIG. 1.

The flow chart of FIG. 4 illustrates the state machine 28 of FIG. 1. An algorithmic process begins in the initiation state 40. A change of the voltage on the sense line 20 may be used to trigger the process or the process may run in a continuous cycle. A clock signal advances the process through the state machine 28. Once initiated, the state machine enters the discharge capacitor state 42. The state machine 28 activates an output pin on the programmable logic device 16 that, in turn, activates the transistor 34 of the discharge circuit 24 (FIG. 3). In the first wait state 44, a timer keeps the process from advancing for a pre-determined period of time. In the first sample state 46, the sense line 22 is sampled by a high-impedance input pin on the programmable logic device 16. The purpose of this sampling is to determine whether the voltage of the sense line Vs(t) has exceeded the minimum threshold voltage Vth necessary to be considered a logic-high state. Another timer is used in the second wait state 48 to stall the process for another predetermined period of time and the sense line is sampled again in the second sample state 50. The process then returns to the initiation state 40.

Results of the sampling states 46,50 can be evaluated to achieve a rough approximation of the value of the terminating capacitor 32 (FIG. 2b). For example, if a logic-high state is achieved during the first sample state 46, then a relatively low value is assigned to the terminating capacitor 32. If a logic-high state is not achieved until the second sample state 50, then a high value may be assigned to the terminating capacitor 32. If no logic-high state is achieved during either of the sample states 46,50, then it may be determined that no capacitor is present (FIG. 2a) or that the value of the capacitor is higher than anticipated. In this manner, a single electrical signal can provide sufficient information to establish one of three disparate conditions. These conditions can be used to identify the type of plug-in card 14.

Additional discrete conditions may be achieved by adding additional wait and sample states. For example, the addition of another wait and sample state may be used to recognize a fourth discrete condition. Yet another wait and sample state can identify a fifth condition. In this manner, the number of discrete conditions that may be ascertained from a single sense line 22 is limited only by the size of the state machine 28. These numerous disparate conditions may be utilized to identify a corresponding number of types of plug-in cards 14 or models of plug-in cards within type groups.

Figure 5:
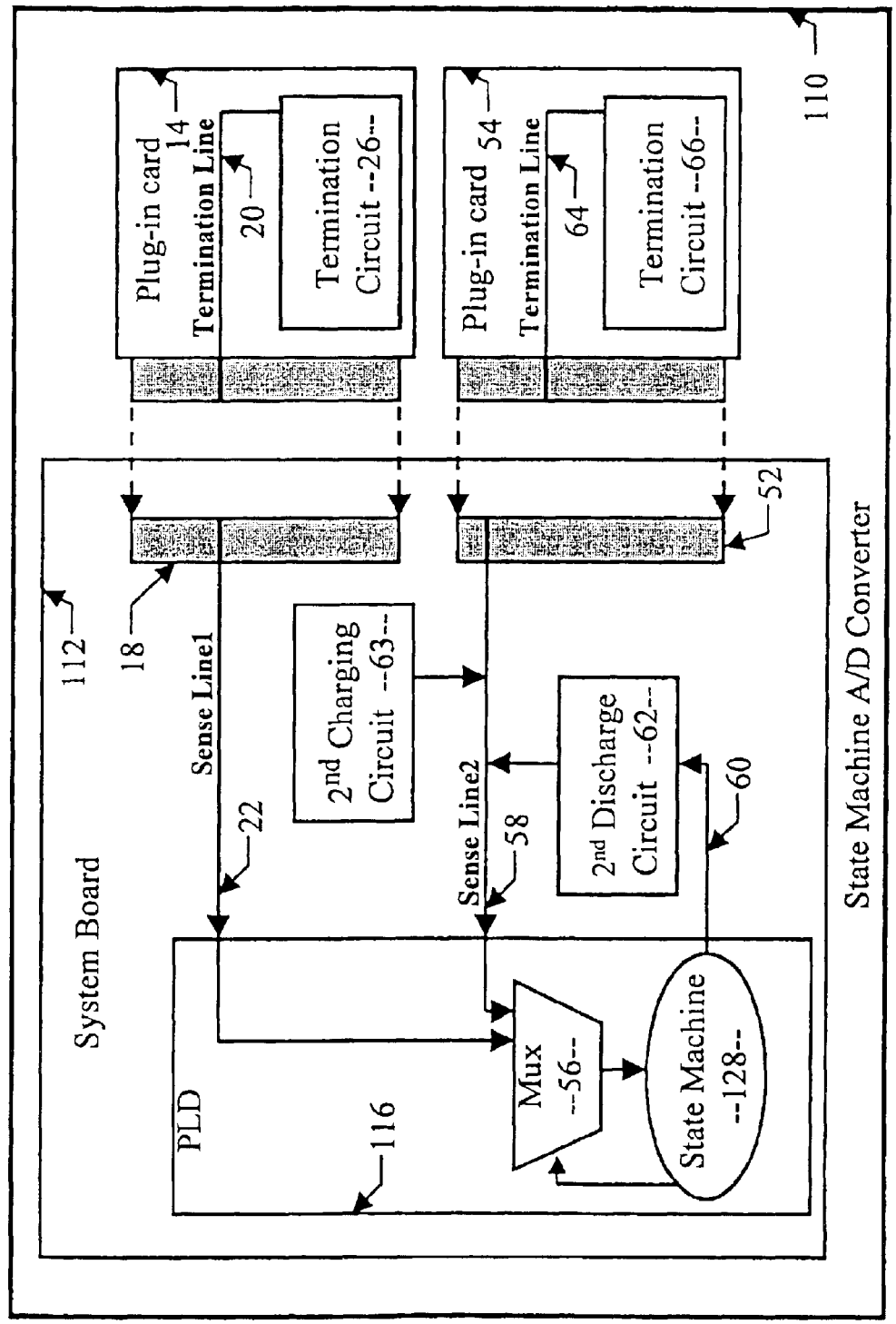
FIG. 5 is a schematic diagram of a state-machine analog-to-digital converter system, utilizing a plurality of sense lines.

In another embodiment of the invention, as illustrated in FIG. 5, a state-machine analog-to-digital converter system 110 includes a second connector 52 for accepting a second plug-in card 54. A multiplexor/de-multiplexor ("MUX") 56 is added to the programmable logic device 16 to accept the first sense line 22 and a second sense line 58. A second control line 60, driven by a state machine 128, controls a second discharge circuit 62. A second charging circuit 63 is connected to the second sense line 58.

Figure 6:
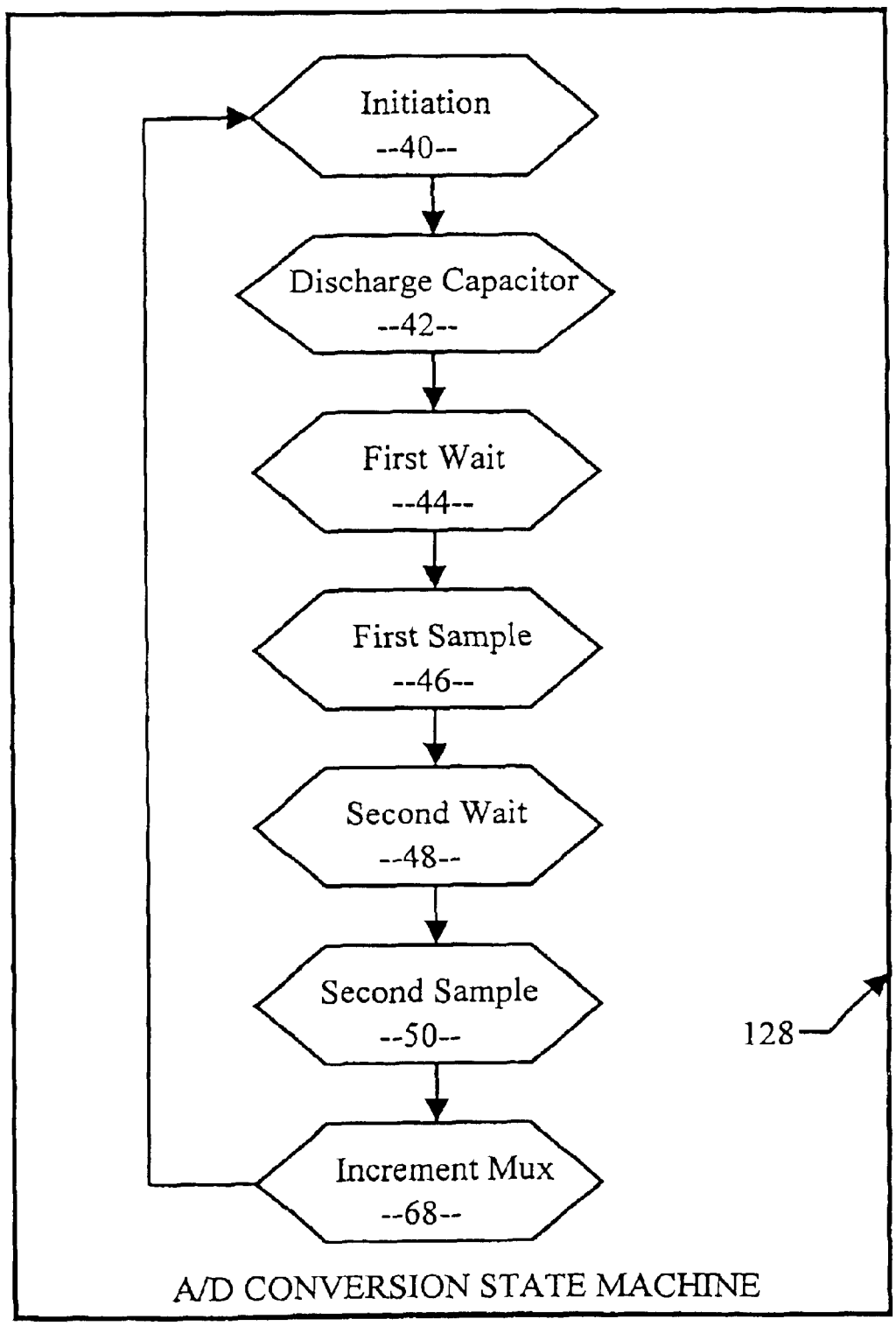
FIG. 6 is a flowchart illustrating an A/D conversion state-machine being utilized to perform analog-to-digital conversion in accordance with the system illustrated in FIG. 5.

The flow chart of FIG. 6 illustrates the state machine 128 of FIG. 5. An increment MUX state 68 has been added to cycle the multiple inputs to the MUX 56. When the state machine 128 has identified the type of the first plug-in card 14 inserted into the first connector 18, the MUX is advanced to pass input from the second sense line 58 to the state machine 128. In this manner, a capacitive property of the second termination circuit 66 may be determined and the type of the second plug-in card 54 may be identified. Additional plug-in cards may be concurrently inserted into the circuit board 12 and identified by increasing the number of connectors, sense lines, and the size of the MUX 56. However, the state machine 128 performs A/D conversion on only one plug-in card at a time.

Figure 7:
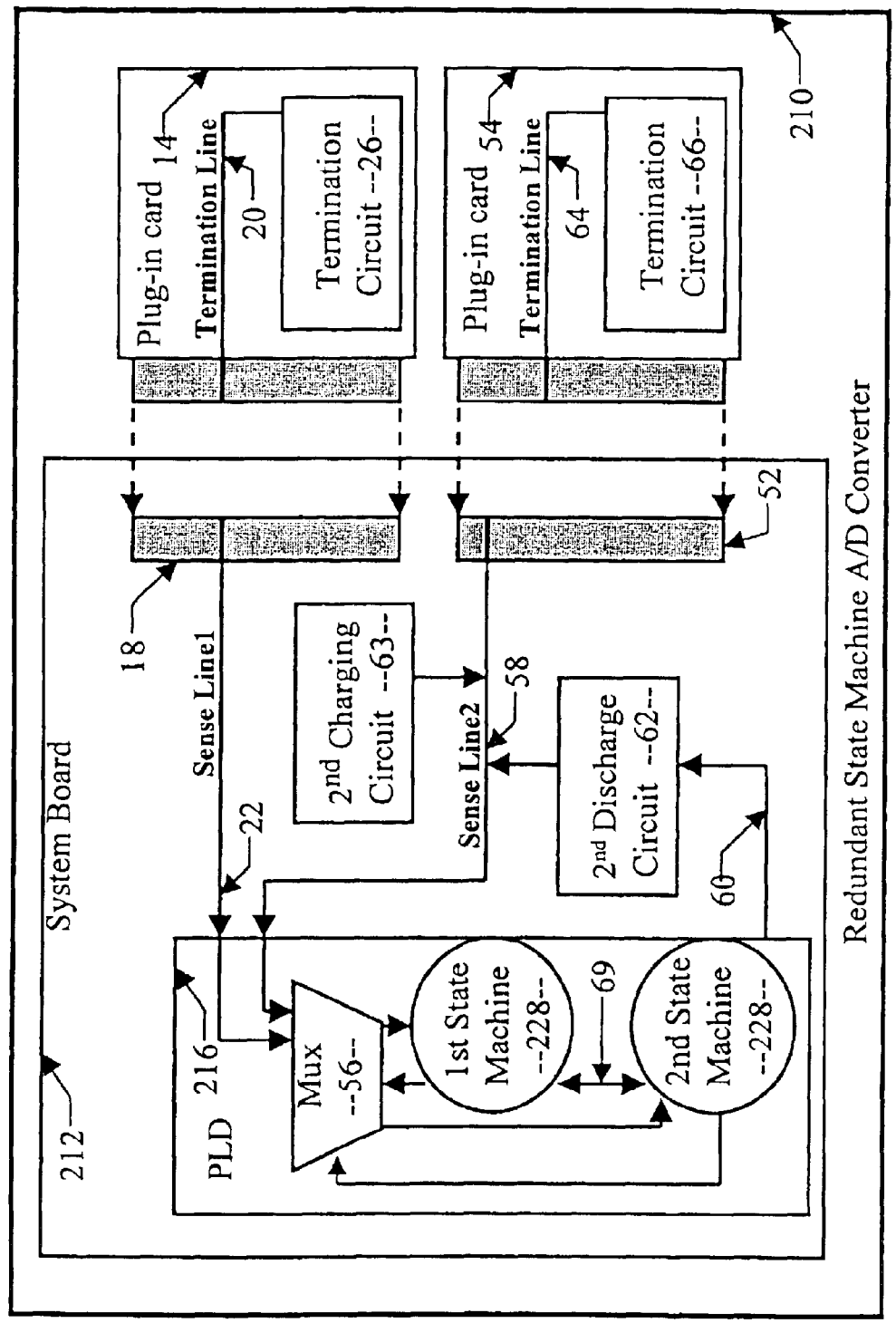
FIG. 7 is a schematic diagram of a redundant state-machine analog-to-digital converter system, wherein a plurality of state machines are utilized.
Figure 8:
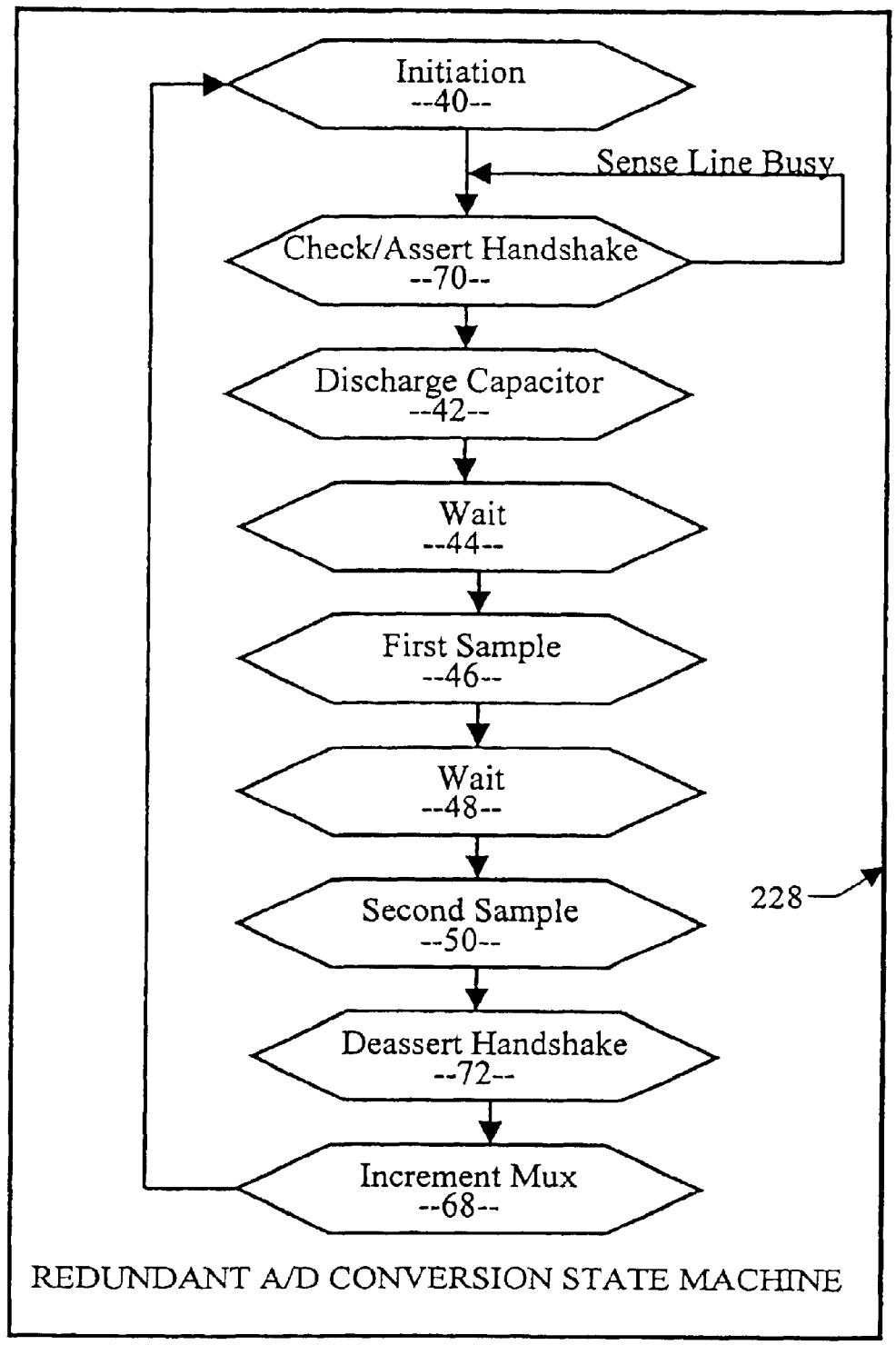
FIG. 8 is a flowchart illustrating a redundant A/D conversion state-machine being utilized to perform analog-to-digital conversion in accordance with the system illustrated in FIG. 7.

To increase the number of plug-in cards that may be simultaneously identified, one or more redundant state machines may be implemented, as exemplified by the schematic diagram of the redundant-state-machine analog-to-digital converter system of FIG. 7. A handshake signal 69 is used to negotiate activity between a first redundant analog-to-digital state-machine 128 and a second redundant analog-to-digital state-machine 228. Only one state machine is allowed to discharge and sample a particular sense line during any period of time. The check/assert handshake state 70 and the deassert handshake state 72 are illustrated in the flow chart of FIG. 8.

Those skilled in the art of making analog-to-digital converters may develop other embodiments of the present invention. For example, redundant A/D converter state-machines may be implemented in separate programmable logic devices.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

We claim:

1. An analog-to-digital converter system, comprising:
    a first charging circuit;
    a first discharge circuit;
    a first termination circuit;
    a first sense line; and
    a programmable logic device including a first state machine;
        wherein said first state machine is structured to direct said first discharge circuit to remove a first residual electric charge from said first sense line,
        said first charging circuit is structured to subsequently place a first additional electric charge on said first sense line,
        said first state machine is structured to subsequently wait for a first pre-determined period of time,
        said first state machine is structured to subsequently sample a first voltage on said first sense line,
        said first state machine is structured to subsequently wait for a second pre-determined period of time,
        said first state machine is structured to subsequently sample a second voltage on said first sense line, and
        said sampled first voltage and said sampled second voltage are subsequently evaluated by said first state machine to determine a first capacitive value of said first termination circuit.

2. The analog-to-digital converter system of claim 1, wherein said first capacitive value is selected from one of at least three potential value ranges, said at least three potential value ranges including a low-capacitive value range, a moderate-capacitive value range, and a high-capacitive value range.

3. The analog-to-digital converter system of claim 2, wherein said first termination circuit includes an electrical path to ground from said first sense line.

4. The analog-to-digital converter system of claim 2, wherein said first termination circuit includes a terminating capacitor.

5. The analog-to-digital converter system of claim 3, wherein said high-capacitive value range is selected for said first capacitive value when said first termination circuit includes said electrical path to ground.

6. The analog-to-digital converter system of claim 1, wherein said first capacitive value corresponds to a first discrete condition.

7. The analog-to-digital converter system of claim 6, further comprising: a first connector; and
    a first plug-in-card for inserting into said first connector; wherein said first termination circuit is located on said first plug-in card.

8. The analog-to-digital converter system of claim 7, wherein said first capacitive value is used to identify said first plug-in card.

9. The analog-to-digital converter system of claim 1, wherein said first state machine is structured to wait for a third pre-determined period of time after said sampling of said second voltage and subsequently sample a third voltage on said first sense line prior to said determining said first capacitive value.

10. The analog-to-digital converter system of claim 9, wherein said first capacitive value is selected from one of at least four potential value ranges.

11. The analog-to-digital converter system of claim 1, further comprising:
   a second discharge circuit;
   a second charging circuit;
   a second termination circuit; and
   a second sense line;
      wherein said first state machine is structured to direct said second discharge circuit to remove a second residual electric charge from said second sense line,
      said second charging circuit is structured to subsequently place a second additional electric charge on said second sense line,
      said first state machine is structured to subsequently wait for a third pre-determined period of time,
      said first state machine is structured to subsequently sample a third voltage on said second sense line,
      said first state machine is structured to subsequently wait for a fourth pre-determined period of time,
      said first state machine is structured to subsequently sample a fourth voltage on said second sense line, and
      said sampled third voltage and said sampled fourth voltage are subsequently evaluated by said first state machine to determine a second capacitive value of said second termination circuit.

12. The analog-to-digital converter system of claim 1, further comprising:
   a second state machine;
   a second discharge circuit;
   a second charging circuit;
   a second termination circuit; and
   a second sense line;
      wherein said second state machine is structured to direct said second discharge circuit to remove a second residual electric charge from said second sense line,
      said second charging circuit is structured to subsequently place a second additional electric charge on said second sense line,
      said second state machine is structured to subsequently wait for a third pre-determined period of time,
      said second state machine is structured to subsequently sample a third voltage on said second sense line,
      said second state machine is structured to subsequently wait for a fourth pre-determined period of time,
      said second state machine is structured to subsequently sample a fourth voltage on said second sense line, and
      said sampled third voltage and said sampled fourth voltage are subsequently evaluated by said second state machine to determine a second capacitive value of said second termination circuit.

13. The analog-to-digital converter system of claim 11, wherein said first capacitive value corresponds to a first discrete condition and said second capacitive value corresponds to a second discrete condition.

14. The analog-to-digital converter system of claim 13, further comprising:
   a first connector;
   a second connector;
   a first plug-in card for inserting into said first connector; and
   a second plug-in card for inserting into said second connector;
      wherein said first termination circuit is located on said first plug-in card,
      said second termination circuit is located on said second plug-in card,
      said first discrete condition is used to identify said first plug-in card, and
      said second discrete condition is used to identify said second plug-in card.

15. An analog-to-digital converter system, comprising:
   an electrical circuit board, said electrical circuit board including
      a first sense line,
      a first charging circuit electrically connected to said first sense line,
      a first discharge circuit electrically connected to said first sense line,
      a first connector electrically connected to said first sense line, and
      a programmable logic device electrically connected to said first sense line and said first discharge circuit, said programmable logic device including a first state machine; and
   a first plug-in card for inserting into said first connector, said first plug-in card including a first termination circuit electrically connected to said first connector;
      wherein said first state machine is structured to direct said first discharge circuit to remove a first residual electric charge from said first sense line,
      said first charging circuit is structured to subsequently place a first additional electric charge on said first sense line,
      said first state machine is structured to subsequently wait for a first pre-determined period of time,
      said first state machine is structured to subsequently sample a first voltage on said first sense line,
      said first state machine is structured to subsequently wait for a second pre-determined period of time,
      said first state machine is structured to subsequently sample a second voltage on said first sense line,
      said sampled first voltage and said sampled second voltage are subsequently evaluated by said first state machine to determine a first capacitive value of said first termination circuit, and
      said first capacitive value is subsequently used to identify said first plug-in card.

16. The analog-to-digital converter system of claim 15, further comprising:
   a second sense line;
   a second charging circuit electrically connected to said second sense line,
   a second discharge circuit electrically connected to said second sense line,
   a second connector electrically connected to said second sense line; and
   a second plug-in card for inserting into said second connector, said second plug-in card including a second termination circuit electrically connected to said second connector;
      wherein said programmable logic device is electrically connected to said second discharge circuit, said first state machine is structured to direct said second discharge circuit to remove a second residual electric charge from said second sense line, said second charging circuit is structured to subsequently place a second additional electric charge on said second sense line, said first state machine is structured to subsequently wait for a third pre-determined period of time, said first state machine is structured to subsequently sample a third voltage on said second sense line, said first state machine is structured to subsequently wait for a fourth pre-determined period of time, said first state machine is structured to subsequently sample a fourth voltage on said second sense line, said sample third voltage and said sampled fourth voltage are subsequently evaluated by said first state machine to determine a second capacitive value of said second termination circuit, and said second capacitive value is subsequently used to identify said second plug-in card.

17. The analog-to-digital converter system of claim 15, further comprising:

a second state machine;

a second sense line;

a second charging circuit electrically connected to said second sense line;

a second discharge circuit electrically connected to said second sense line;

a second connector electrically connected to said second sense line; and a second plug-in card for inserting into said second connector, said second plug-in card including a second termination circuit electrically connected to said second connector;

wherein said programmable logic device is electrically connected to said second discharge circuit, said second state machine is structured to direct said second discharge circuit to remove a second residual electric charge from said second sense line, said second charging circuit is structured to subsequently place a second additional electric charge on said second sense line, said second state machine is structured to subsequently wait for a third pre-determined period of time, said second state machine is structured to subsequently sample a third voltage on said second sense line, said second state machine is structured to subsequently wait for a fourth pre-determined period of time, said second state machine is structured to subsequently sample a fourth voltage on said second sense line, said sampled third voltage and said sampled fourth voltage are subsequently evaluated by said second state machine to determine a second capacitive value of said second termination circuit, and said second capacitive value is subsequently used to identify said second plug-in card.

18. An analog-to-digital converter system, comprising a first electrical circuit board including a termination circuit;

wherein said first electrical circuit board is structured to be electrically connected to a second electrical circuit board including a sense line, a charging circuit electrically connected to said sense line, a discharge circuit electrically connected to said sense line, and a programmable logic device including a state machine;

said state machine is structured to direct said discharge circuit to remove a residual electric charge from said sense line;

said charging circuit is structured to subsequently place an additional electric charge on said sense line, said state machine is structured to subsequently wait for a first pre-determined period of time;

said state machine is structured to subsequently sample a first voltage on said sense line;

said state machine is structured to subsequently wait for a second pre-determined period of time;

said state machine is structured to subsequently sample a second voltage on said sense line;

said sense line is electrically connected with said termination circuit;

said sampled first voltage and said sampled second voltage are subsequently evaluated by said machine to determine a capacitive value of said termination circuit; and said capacitive value is used to subsequently identify said first electrical circuit board.

* * * * *

UNITED STATES PATENT AND TRADEMARK OFFICE
CERTIFICATE OF CORRECTION

PATENT NO.    : 6,809,675 B1
DATED         : October 26, 2004
INVENTOR(S)   : Matthew D. Bomhoff et al.

It is certified that error appears in the above-identified patent and that said Letters Patent is hereby corrected as shown below:

Column 7,
Line 4, after "and" add -- to --

Signed and Sealed this

Twenty-fourth Day of May, 2005

JON W. DUDAS
*Director of the United States Patent and Trademark Office*